US012771321B2

(12) United States Patent
Zhou

(10) Patent No.: US 12,771,321 B2
(45) Date of Patent: Oct. 20, 2026

(54) SURFACE ACOUSTIC WAVE RESONATOR DEVICE AND MANUFACTURING METHOD THEREFOR, AND FILTER

(71) Applicant: Shenzhen Newsonic Technologies Co., Ltd., Shenzhen (CN)

(72) Inventor: Chencheng Zhou, Shenzhen (CN)

(73) Assignee: Shenzhen Newsonic Technologies Co., Ltd., Shenzhen (CN)

(*) Notice: Subject to any disclaimer, the term of this patent is extended or adjusted under 35 U.S.C. 154(b) by 0 days.

(21) Appl. No.: 18/954,589

(22) Filed: Nov. 21, 2024

(65) Prior Publication Data

US 2025/0080084 A1 Mar. 6, 2025

Related U.S. Application Data

(63) Continuation of application No. PCT/CN2023/138651, filed on Dec. 14, 2023.

(30) Foreign Application Priority Data

Dec. 14, 2022 (CN) ........................ 202211602698.5

(51) Int. Cl.
*H03H 9/25* (2006.01)
*H03H 3/08* (2006.01)
(Continued)

(52) U.S. Cl.
CPC ................ *H03H 9/25* (2013.01); *H03H 3/08* (2013.01); *H03H 9/02834* (2013.01); *H03H 9/64* (2013.01)

(58) Field of Classification Search
CPC .. H03H 9/02; H03H 9/17; H03H 9/25; H03H 9/64
See application file for complete search history.

(56) References Cited

U.S. PATENT DOCUMENTS 8,723,624 B2 * 5/2014 Kurahashi ............ H03H 9/0222 333/195
10,476,471 B2 * 11/2019 Taniguchi .......... H03H 9/02086
(Continued)

FOREIGN PATENT DOCUMENTS

CN 111726101 A * 9/2020 ......... H03H 9/14502
CN 113640982 A 11/2021
(Continued)

OTHER PUBLICATIONS

International Search Report cited in PCT/CN2023/138651, dated Mar. 20, 2024, 9 pages.

*Primary Examiner* — Andrea Lindgren Baltzell
*Assistant Examiner* — Alan Wong
(74) *Attorney, Agent, or Firm* — LEASON ELLIS LLP

(57) ABSTRACT

The present disclosure provides a surface acoustic wave resonator device and manufacturing method therefor, and filter, the surface acoustic wave resonator device includes: an interdigital transducer located on a base substrate and including: first and second interdigital electrode lead-out parts; a plurality of first interdigital electrodes; and a plurality of second interdigital electrodes, disposed to be offset and parallel to the plurality of first interdigital electrodes, each interdigital electrode includes a body structure and a protruding structure which are integrally formed, the protruding structure is disposed at an end portion of the each interdigital electrode and protruded from a surface of the body structure at a side away from the base substrate in a third direction perpendicular to the base substrate, wherein the protruding structure and the body structure have sidewalls aligned with each other in the third direction.

9 Claims, 6 Drawing Sheets

(51) Int. Cl.
*H03H 9/02* (2006.01)
*H03H 9/64* (2006.01)

(56) References Cited

U.S. PATENT DOCUMENTS

| | | | | |
|---|---|---|---|---|
| 10,707,833 | B2 * | 7/2020 | Mimura | H03H 9/02834 |
| 10,763,818 | B2 * | 9/2020 | Sakashita | H03H 9/6483 |
| 11,437,563 | B2 * | 9/2022 | Park | H10N 30/20 |
| 11,469,737 | B2 * | 10/2022 | Saji | H03H 9/1457 |
| 11,533,038 | B2 * | 12/2022 | Fukuda | H03H 9/25 |
| 2011/0140808 | A1 * | 6/2011 | Kurahashi | H03H 9/059 333/193 |
| 2019/0097607 | A1 * | 3/2019 | Mimura | H03H 9/14541 |
| 2019/0149125 | A1 * | 5/2019 | Saji | H03H 9/02858 310/313 B |

FOREIGN PATENT DOCUMENTS

| | | | |
|---|---|---|---|
| CN | 114531130 | A | 5/2022 |
| CN | 115133900 | A | 9/2022 |
| CN | 115296642 | A | 11/2022 |
| CN | 115603694 | A | 1/2023 |

* cited by examiner

SURFACE ACOUSTIC WAVE RESONATOR DEVICE AND MANUFACTURING METHOD THEREFOR, AND FILTER

CROSS-REFERENCE TO RELATED APPLICATION

This application is a continuation of International Patent Application No. PCT/CN2023/138651, filed on Dec. 14, 2023, which claims the priority of Chinese Patent Application No. 202211602698.5 filed on Dec. 14, 2022, the entire disclosure of the which is incorporated herein by reference as part of the present application.

TECHNICAL FIELD

Embodiments of the present disclosure relate to the field of resonators and filters, and in particular to a surface acoustic wave resonator device, a manufacturing method therefor and a filter.

BACKGROUND

In the structure of a surface acoustic wave (SAW) device, it is usually necessary to stack a small block of metal on both ends of an interdigital electrode to form a protruding structure (usually referred to as a Hammer Head), so as to suppress clutter and ensure excellent filter performance. The best clutter suppression effect can be achieved in a case where an edge of the protruded metal block is completely aligned with an edge of an end of the interdigital electrode in a vertical direction. The protruded metal block is additionally formed on the end of the interdigital electrode through a lift-off process after the interdigital electrode is formed; that is, the protruded metal block and the interdigital electrode are not integrally-formed material layer, but are two independent material layers. The lift-off process includes performing a photolithography process (including photoresist coating, exposure and development) on a wafer to obtain a window exposing the end of the interdigital electrode, then evaporating the metal, and lifting off the photoresist and the metal attached on the photoresist, thereby leaving the metal deposited on the end of the interdigital electrode, so as to obtain the protruded metal block structure on the end of the interdigital electrode.

However, there is an alignment deviation with respect to the interdigital electrode layer during the photolithography process, and a window width of the photolithography process per se is also varied to a certain extent, which will cause the protruded metal block not to be completely aligned with the edge of the end of the interdigital electrode in the vertical direction. Thus, the clutter suppression effect may be affected, and differences in clutter suppression effect may be incurred, and the performance and the individual consistency of the filter are affected.

SUMMARY

In order to enable a basic understanding of some aspects of the disclosed embodiments, a brief summary is given below. This summary is neither a general comment nor is intended to identify key/important components or delineate the scope of protection of these embodiments, but is a preface to the detailed description that follows.

The embodiments of the present disclosure provide a surface acoustic wave resonator device, a manufacturing method therefor and a filter. In the surface acoustic wave resonator device, the end protrusion of the interdigital electrode and the body structure of the interdigital electrode are completely aligned with each other in the vertical direction, so that the clutter suppression effect is improved, and the performance and individual consistency of the resonators and the filter are ensured.

An embodiment of the present disclosure provides a surface acoustic wave resonator device, including: a base substrate; and an interdigital transducer, located on the base substrate and including: a first interdigital electrode lead-out part; a second interdigital electrode lead-out part; a plurality of first interdigital electrodes, wherein each of the plurality of first interdigital electrodes has one end connected with the first interdigital electrode lead-out part, and another end facing and spaced apart from the second interdigital electrode lead-out part; and a plurality of second interdigital electrodes, wherein the plurality of second interdigital electrodes and the plurality of first interdigital electrodes extend parallel to each other in a first direction and are alternately arranged at intervals in a second direction, wherein each of the plurality of second interdigital electrodes has one end connected with the second interdigital electrode lead-out part, and another end facing and spaced apart from the first interdigital electrode lead-out part; wherein among the plurality of first interdigital electrodes and the plurality of second interdigital electrodes, each interdigital electrode includes a body structure and a protruding structure which are integrally formed, the protruding structure is disposed at an end portion of the each interdigital electrode and protruded from a surface of the body structure at a side away from the base substrate in a third direction perpendicular to a main surface of the base substrate, and wherein the protruding structure and the body structure have sidewalls aligned with each other in the third direction.

For example, in the surface acoustic wave resonator device, each interdigital electrode includes a central part, a first end part, a second end part and a connecting part, the first end part and the second end part are located at two opposite sides of the central part in the first direction, and together constitute the end portion of the interdigital electrode; and the connecting part is located at a side of the second end part away from the central part in the first direction, and is connected to a corresponding one of the first interdigital electrode lead-out part and the second interdigital electrode lead-out part; in each interdigital electrode, a thickness of the end portion including the protruding structure is greater than a thickness of the central part, and there is free of interface between the protruding structure and the body structure.

For example, in the surface acoustic wave resonator device, the first end part and the second end part each include an end body and an end protrusion, and the end protrusion is located on a side of the end body away from the base substrate; in each interdigital electrode, the central part, the connecting part and the end bodies of the first end part and the second end part together constitute the body structure of the interdigital electrode; and the end protrusions of the first end part and the second end part together constitute the protruding structure.

For example, in the surface acoustic wave resonator device, in each end part, widths of the end body and the end protrusion in the first direction are equal to each other, widths of the end body and the end protrusion in the second direction are equal to each other; and a plurality of sidewalls of the end body and a plurality of sidewalls of the end protrusion are respectively aligned with each other in the third direction.

For example, the surface acoustic wave resonator device further includes: a temperature compensation layer, disposed on the base substrate and covering surfaces of the plurality of first interdigital electrodes, the plurality of second interdigital electrodes, the first interdigital electrode lead-out part and the second interdigital electrode lead-out part.

For example, in the surface acoustic wave resonator device, the temperature compensation layer has a first through hole and a second through hole, the first through hole exposes a portion of a surface of the first interdigital electrode lead-out part, and the second through hole exposes a portion of a surface of the second interdigital electrode lead-out part.

For example, the surface acoustic wave resonator device further includes: a first conductive connector, connected with the first interdigital electrode lead-out part through the first through hole; and a second conductive connector, connected with the second interdigital electrode lead-out part through the second through hole.

For example, the surface acoustic wave resonator device further includes: a passivation layer, covering surfaces of the temperature compensation layer, the first conductive connector and the second conductive connector.

For example, in the surface acoustic wave resonator device, the passivation layer has a first contact window and a second contact window, and the first contact window exposes a portion of a surface of the first conductive connector; the second contact window exposes a portion of a surface of the second conductive connector.

An embodiment of the present disclosure provides a filter, including any one of the above-mentioned surface acoustic wave resonator devices.

An embodiment of the present disclosure provides a manufacturing method for a surface acoustic wave resonator device, including: providing a base substrate; forming a plurality of interdigital electrodes on the base substrate, wherein the plurality of interdigital electrodes include first interdigital electrodes and second interdigital electrodes which extend parallel to each other in a first direction and are alternately arranged at intervals in a second direction, wherein each interdigital electrode includes a central part and an end portion located at two opposite sides of the central part in the first direction, and the central part and the end portion have a same thickness which is a first thickness; and performing a thinning process to thin a thickness of the central parts of the plurality of interdigital electrodes from the first thickness to a second thickness, so that the first thickness of the end portion is greater than the second thickness of the central part, and the end portion has a protruding structure protruded from the central part in a third direction perpendicular to a main surface of the base substrate.

For example, in the manufacturing method for the surface acoustic wave resonator device, each interdigital electrode further includes a connecting part, the end portion includes a first end part and a second end part, and the connecting part is located at a side of the second end part away from the central part; the thinning process further includes: thinning a thickness of the connecting part from the first thickness to the second thickness.

For example, the manufacturing method for the surface acoustic wave resonator device further includes: forming a first interdigital electrode lead-out part and a second interdigital electrode lead-out part on the base substrate while forming the plurality of interdigital electrodes, wherein the first interdigital electrode lead-out part is connected with the first interdigital electrodes, and the second interdigital electrode lead-out part is connected with the second interdigital electrodes; wherein the thinning process further includes: thinning a thickness of the first interdigital electrode lead-out part and a thickness of the second interdigital electrode lead-out part from the first thickness to the second thickness.

For example, in the manufacturing method for the surface acoustic wave resonator device, thinning the central parts of the plurality of interdigital electrodes to the second thickness includes: forming a mask layer on the base substrate to cover a surface of the base substrate, portions of sidewalls of the plurality of interdigital electrodes, and surfaces of end portions of the plurality of interdigital electrodes away from the base substrate, and to expose top portions of the central parts of the plurality of interdigital electrodes away from the base substrate; performing an etching process on the plurality of interdigital electrodes by using the mask layer as an etching mask, so as to remove the top portions of the central parts of the plurality of interdigital electrodes away from the base substrate; and removing the mask layer.

For example, in the manufacturing method for the surface acoustic wave resonator device, forming the mask layer includes: forming an initial mask layer to cover sidewalls of the plurality of interdigital electrodes, surfaces of the plurality of interdigital electrodes at a side away from the base substrate, and the surface of the base substrate; and performing a patterning process on the initial mask layer to remove a portion of the initial mask layer, and to form the mask layer including a first mask part and a second mask part, wherein the first mask part covers the surface of the base substrate and portions of sidewalls of the plurality of interdigital electrodes, and the second mask part covers surfaces of the end portions of the plurality of interdigital electrodes at a side away from the base substrate.

For example, in the manufacturing method for the surface acoustic wave resonator device, after forming the plurality of interdigital electrodes, further including: forming a temperature compensation layer on the base substrate to cover the base substrate and the plurality of interdigital electrodes; forming a first through hole and a second through hole in the temperature compensation layer, wherein the first through hole exposes a portion of a surface of the first interdigital electrode lead-out part, and the second through hole exposes a portion of a surface of the second interdigital electrode lead-out part; forming a first conductive connector and a second conductive connector, wherein the first conductive connector is connected to the first interdigital electrode lead-out part through the first through hole, and the second conductive connector is connected to the second interdigital electrode lead-out part through the second through hole; forming a passivation layer to cover the temperature compensation layer, the first conductive connector and the second conductive connector; and etching the passivation layer to form a first contact window and a second contact window for external electrical connection.

For example, in the manufacturing method for the surface acoustic wave resonator device, materials of the first interdigital electrodes and the second interdigital electrodes include at least one selected from a group consisting of Ti, Cr, Ag, Cu, Mo, Pt, W and Al.

For example, in the manufacturing method for the surface acoustic wave resonator device, a material of the temperature compensation layer is a single layer of $SiO_2$; or a combined stack layer of SiN, AlN, amorphous silicon or GaN material with $SiO_2$; materials of the first conductive connector and the second conductive connector include at least one selected from a group consisting of Ti, Cr, Al, Cu, Ni, Ag and Au; and a material of the passivation layer includes at least one selected from a group consisting of SiN, AlN, amorphous silicon and GaN material.

The embodiments of the present disclosure provide a surface acoustic wave resonator device, a manufacturing method therefor and a filter, which can achieve the following technical effects:

In the present disclosure, protruding structures are formed at the interdigital electrode end of the first interdigital electrode and the interdigital electrode end of the second interdigital electrode, that is, the protruding structure at the interdigital electrode end and the body structure of the interdigital electrode are integrally-formed material layer without an interface therebetween, and the protruding structure is aligned with the body structure of the corresponding interdigital electrode in the vertical direction, thus avoiding the alignment deviation with respect to the interdigital electrode during the photolithography process, avoiding the differences in clutter suppression effect of the protruding structures, and further improving the performance and individual consistency of the resonators and the filter.

Both the above general description and the following description are illustrative and explanatory only, and are not used to limit the present disclosure.

BRIEF DESCRIPTION OF THE DRAWINGS

One or more embodiments are illustratively explained through corresponding drawings thereof, which do not constitute any limitation of the embodiments. Elements with the same reference numerals in the drawings are shown as similar elements, and the drawings do not constitute any limitation of scales.

DETAILED DESCRIPTION

Figure 1:
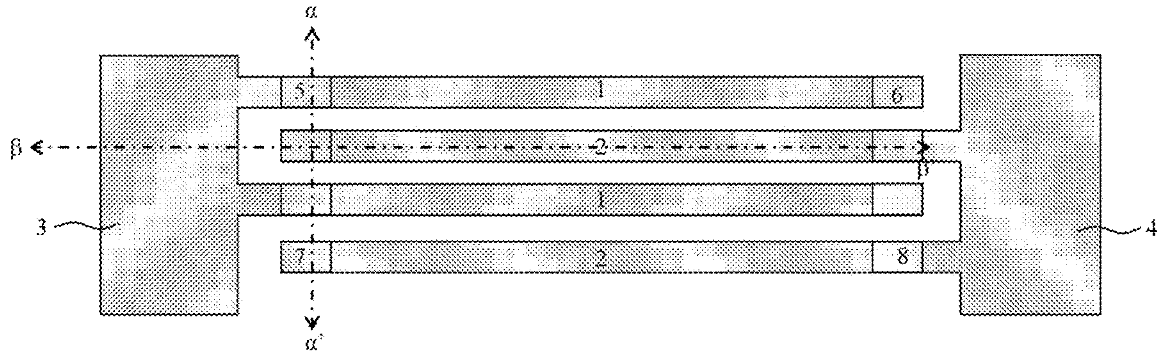
FIG. 1 is a schematic plan view of a surface acoustic wave resonator device in the related art.

In order to understand the characteristics and technical contents of the embodiments of the present disclosure in more details, the implementation of the embodiments of the present disclosure will be described specifically as below in connection with the accompanying drawings, which are for reference and explanation only and are not used to limit the embodiments of the present disclosure. In the following technical description, for the convenience of explanation, numerous details are set forth to provide a thorough understanding of the disclosed embodiments. However, one or more embodiments may still be practiced without these details. In other cases, to simplify the drawings, well-known structures and devices may be presented in a simplified form.

The terms such as “first”, “second” and the like in the description and claims of the embodiments of the present disclosure and the above drawings are used to distinguish similar objects, and are not necessarily used to describe a specific order or sequence. It should be understood that the data thus used can be interchanged under appropriate circumstances so as to facilitate describing the embodiments of the present disclosure here. Furthermore, the terms “include”, “have” and any variations thereof are intended to cover non-exclusive inclusions.

In the embodiments of the present disclosure, the orientations or positional relationships indicated by the terms “on”, “below”, “inside”, “between”, “outside”, “in front of” and “behind” are based on the orientations or positional relationships shown in the accompanying drawings. These terms are mainly used to better describe the embodiments of the present disclosure and examples thereof, but are not used to limit that the indicated devices, elements or components must have a specific orientation or be constructed and operated in a specific orientation. Moreover, some of the above terms can be used to indicate not only the orientations or positional relationships, but also other meanings. For example, the term “on” may also be used to indicate a certain dependency or connection relationship in some cases. For those ordinary skilled in the art, the specific meanings of these terms in the embodiments of the present disclosure can be understood according to specific situations.

In addition, the terms “dispose”, “connect” and “fix” should be understood broadly. For example, “connection” may be a fixed connection, a detachable connection, or an integral structure; it may be mechanical connection, or electrical connection; it may be direct connection, or indirect connection through an intermedium, or internal connection between two devices, elements or components. For those ordinary skilled in the art, the specific meanings of the above terms in the embodiments of the present disclosure can be understood according to specific situations.

Unless otherwise specified, the term “a plurality of” means two or more.

In the embodiment of the present disclosure, the character “/” indicates that the former object and the latter object are in an “or” relationship. For example, “A/B” stands for: A or B.

The term “and/or” is a description of the relationship between objects, indicating that there may be three kinds of relationships. For example, “A and/or B” stands for the following three relationships: A; or B; or, A and B.

It should be noted that the embodiments of the present disclosure and the features in the embodiments can be combined with each other in case of no confliction.

In some embodiments, the surface acoustic wave resonator device excites surface acoustic waves through a piezoelectric material and regular comb electrodes.

In some embodiments, the surface acoustic wave resonator device may be a temperature compensated surface acoustic wave (TC-SAW) resonator device. The TC-SAW resonator device technically improves the conventional SAW resonator by covering the interdigital transducer (IDT) with a temperature compensation layer. As a result, the frequency temperature coefficient of the device is reduced to 0 to −25 ppm/° C., which exhibits significant improvement as compared with the temperature characteristics of the conventional SAW (usually about −45 to −60 ppm/° C.).

Figure 4:
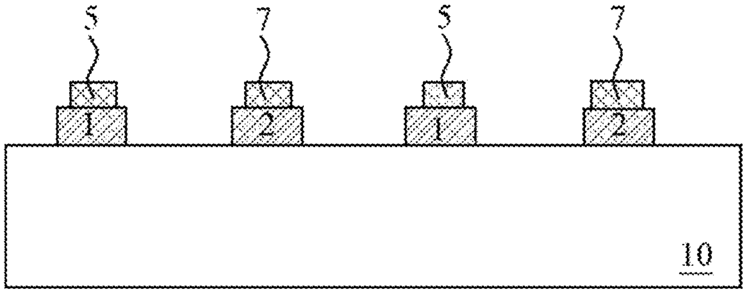
FIG. 4 illustrates a schematic structural view of a surface acoustic wave resonator device taken along line α-α' in FIG. 1 in another deviated state.
Figure 5:
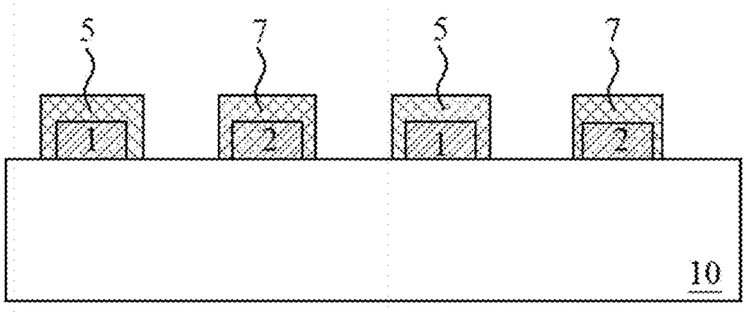
FIG. 5 illustrates a schematic structural view of a surface acoustic wave resonator device taken along line α-α' in FIG. 1 in yet another deviated state.
Figure 6:
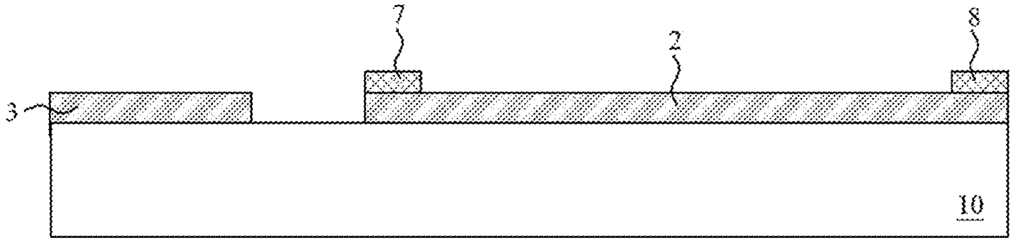
FIG. 6 illustrates a schematic cross-sectional view of a surface acoustic wave resonator device taken along line β-β' of FIG. 1 in an ideal state.
Figure 7:
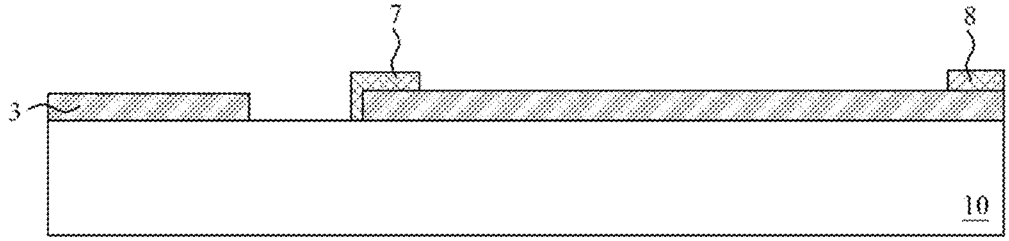
FIG. 7 illustrates a schematic cross-sectional view of a surface acoustic wave resonator device taken along line β-β' of FIG. 1 in a deviated state.

FIG. 1 illustrates a schematic plan view of interdigital electrodes and protruding structures at ends of the interdigital electrodes of a surface acoustic wave resonator device in the related art, and FIG. 2 to FIG. 5 illustrate schematic cross-sectional views of the surface acoustic wave resonator device taken along line α-α' of FIG. 1 in various cases; FIG. 6 and FIG. 7 illustrate schematic cross-sectional views of the surface acoustic wave resonator device taken along line β-β' of FIG. 1 in various cases. In the present disclosure, cross-sectional views taken along line α-α' and line β-β' are used to explain the cases where the protruding structure at the end of the interdigital electrode may not be completely aligned with the interdigital electrode in the vertical direction.

Referring to FIG. 1 to FIG. 7, a surface acoustic wave resonator device includes a piezoelectric substrate 10, a first interdigital electrode 1, a second interdigital electrode 2, a first interdigital electrode lead-out part 3, a second interdigital electrode lead-out part 4, and a protruded metal block 5, a protruded metal block 6, a protruded metal block 7 and a protruded metal block 8. The first interdigital electrode 1 is connected with the first interdigital electrode lead-out part 3; and the protruded metal block 5 and the protruded metal block 6 are respectively disposed above two ends of the first interdigital electrode 1. The second interdigital electrode 2 is connected with the second interdigital electrode lead-out part 4; and the protruded metal block 7 and the protruded metal block 8 are respectively disposed above two ends of the second interdigital electrode 2.

Figure 2:
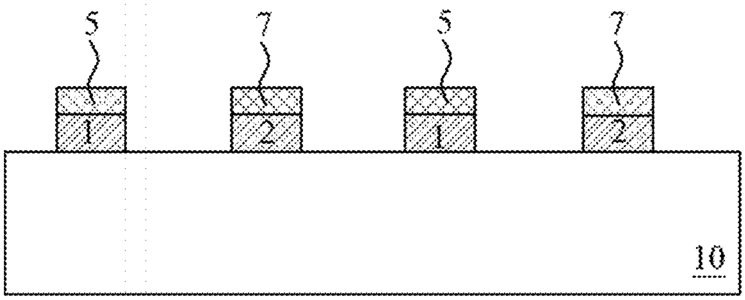
FIG. 2 illustrates a schematic cross-sectional view of a surface acoustic wave resonator device taken along line α-α' of FIG. 1 in an ideal state.
Figure 3:
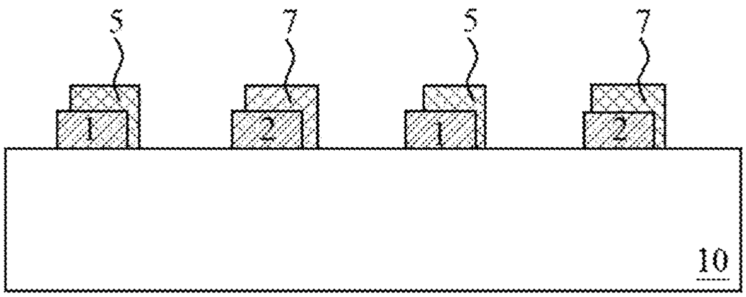
FIG. 3 illustrates a schematic structural view of a surface acoustic wave resonator device taken along line α-α' in FIG. 1 in a deviated state.

For the cross section taken along line α-α', as shown in FIG. 2, in an ideal state, the protruded metal block on the end of the interdigital electrode is completely aligned with the interdigital electrode in the vertical direction. FIG. 3 to FIG. 5 illustrate various situations in which the protruded metal block and the interdigital electrode are not completely aligned in the vertical direction. As shown in FIG. 3, the protruded metal block on the end of the interdigital electrode is not aligned with the interdigital electrode in the vertical direction, and the protruded metal block is offset towards one side with relative to the interdigital electrode in a direction parallel to a main surface of the piezoelectric substrate; as shown in FIG. 4, the protruded metal block on the end of the interdigital electrode has a too small width, which is narrower than that of the interdigital electrode; as shown in FIG. 5, the protruded metal block on the end of the interdigital electrode has a too large line width, which is wider than that of the interdigital electrode.

For the cross-sectional view taken along line β-β', as shown in FIG. 6, in an ideal state, the protruded metal block on the end of the interdigital electrode is completely aligned with the interdigital electrode in the vertical direction; as shown in FIG. 7, in some other cases, the protruded metal block on the end of the interdigital electrode is not aligned with the interdigital electrode in the vertical direction, and the protruded metal block is offset towards one side with relative to the interdigital electrode in the direction parallel to the main surface of the piezoelectric substrate.

In the above-described surface acoustic wave resonator device, the protruded metal block and the interdigital electrode are formed from two material layers in two independent patterning processes. However, due to process deviation, the protruded metal block may not be completely aligned with the edge of the end of the interdigital electrode, as shown in FIGS. 3-5 and 7; and the relative relationships between different interdigital electrodes and their corresponding protruded metal blocks may not be consistent, which may lead to differences in clutter suppression effects of the plurality of protruded metal blocks, and may further affect the performance and the individual consistency of the resonator and the filter including the resonator.

Figure 8:
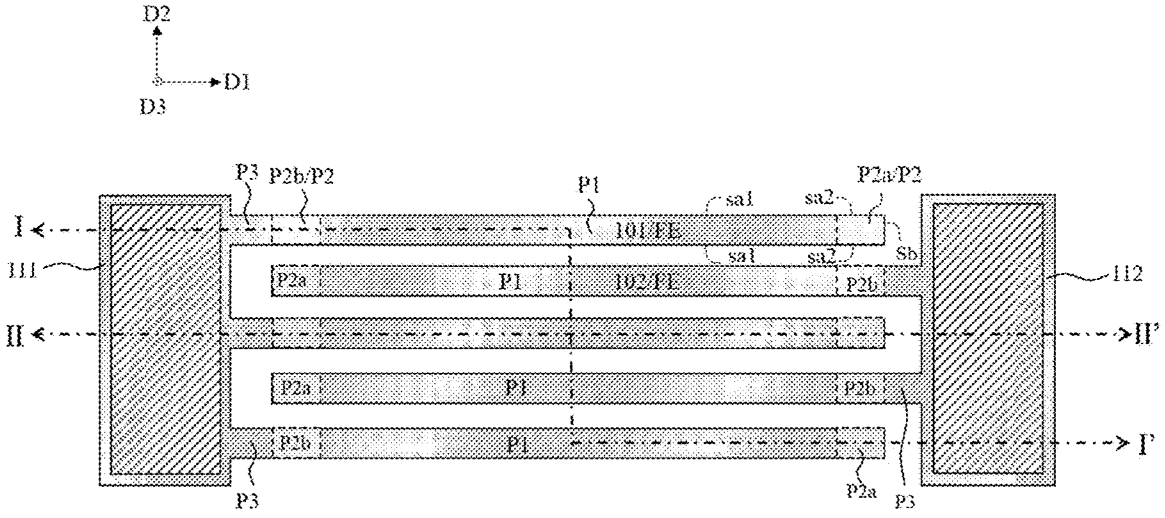
FIG. 8 is a schematic top view of a surface acoustic wave resonator device provided by some embodiments of the present disclosure.

In order to solve the above technical problems, an embodiment of the present disclosure provides a surface acoustic wave resonator device as shown in FIG. 8.

Referring to FIG. 8, in some embodiments, a surface acoustic wave resonator device includes a base substrate 100 and an interdigital transducer disposed on a side of the base substrate 100. For example, the base substrate 100 may be or include a piezoelectric substrate, and may include a piezoelectric material such as lithium niobate and lithium tantalate. The interdigital transducer includes a plurality of interdigital electrodes FE, a first interdigital electrode lead-out part 111 and a second interdigital electrode lead-out part 112. The plurality of interdigital electrodes FE may include a plurality of first interdigital electrodes 101 and a plurality of second interdigital electrodes 102; the plurality of first interdigital electrodes 101 and the plurality of second interdigital electrodes 102 may be disposed in an offset parallel manner, that is, the plurality of first interdigital electrodes 101 and the plurality of second interdigital electrodes 102 extend substantially parallel to each other in a first direction D1 and are alternately arranged at intervals in a second direction D2; each first interdigital electrode 101 has one end connected with the first interdigital electrode lead-out part 111, and another end facing and spaced apart from the second interdigital electrode lead-out part 112.

Each second interdigital electrode 102 has an end connected with the second interdigital electrode lead-out part 112, and another end facing and spaced apart from the first interdigital electrode lead-out part 111.

For example, the first interdigital electrode lead-out part 111 and the second interdigital electrode lead-out part 112 are located at two opposite sides of the plurality of interdigital electrodes in the first direction. Specifically, the first interdigital electrode lead-out part 111 is located at a side of the plurality of first interdigital electrodes 101 in the first direction D1, and is connected with the plurality of first interdigital electrodes 101, so that the plurality of first interdigital electrodes 101 are electrically connected with each other through the first interdigital electrode lead-out part 111. Similarly, the second interdigital electrode lead-out part 112 is located at a side of the plurality of second interdigital electrodes 102 in the first direction D1, and is connected with the plurality of second interdigital electrodes 102, so that the plurality of second interdigital electrodes 102 are electrically connected with each other through the second interdigital electrode lead-out part 112.

In some embodiments, each interdigital electrode FE includes a central part P1, a first end part P2*a*, a second end part P2*b* and a connecting part P3 which are connected with each other. In each interdigital electrode, the first end part P2*a* and the second end part P2*b* are located at two opposite sides of the central part P1 in the first direction D1, and the connecting part P3 is located at a side of the second end part P2*b* away from the central part P1 and is connected with a corresponding one of the first interdigital electrode lead-out part 111 and the second interdigital electrode lead-out part 112; wherein the first end part P2*a* and the second end part P2*b* together constitute the end portion P2 of the interdigital electrode. The central part P1, the first end part P2*a*, the second end part P2*b* and the connecting part P3 of each interdigital electrode are connected with each other, are continuous, and are integrally formed; that is, there is no interface between various parts of each interdigital electrode. In some embodiments, the interdigital electrode and the interdigital electrode lead-out part connected with each other may also be integrally formed.

The central parts P1 of the plurality of first interdigital electrodes 101 and the central parts P1 of the plurality of second interdigital electrodes 102 overlap (for example, completely overlap) with each other in the second direction D2, and have the same width in the first direction. The first end parts P2*a* of the plurality of first interdigital electrodes 101 and the second end parts P2*b* of the plurality of second interdigital electrodes 102 are aligned and overlapped (for example, completely overlapped) with each other in the second direction D2, and may have the same width in the first direction. The second end parts P2*b* of the plurality of first interdigital electrodes 101 and the first end parts P2*a* of the plurality of second interdigital electrodes 102 are aligned and overlapped (for example, completely overlapped) with each other in the second direction D2, and may have the same width in the first direction. The connecting parts P3 of the plurality of first interdigital electrodes 101 extend beyond the first end parts P2*a* of the second interdigital electrodes 102 in the first direction D1, and are located between the second end parts P2*b* of the plurality of first interdigital electrodes 101 and the first interdigital electrode lead-out part 111. The connecting parts P3 of the plurality of first interdigital electrodes 101 do not overlap with the second interdigital electrodes 102 in the second direction D2. The connecting parts P3 of the plurality of second interdigital electrodes 102 extend beyond the first end parts P2*a* of the first interdigital electrodes 101 in the first direction D1, and are located between the second end parts P2*b* of the plurality of second interdigital electrodes 102 and the second interdigital electrode lead-out part 112. The connecting parts P3 of the plurality of second interdigital electrodes 102 do not overlap with the first interdigital electrodes 101 in the second direction D2.

In some embodiments, each interdigital electrode has a protruding structure (which is also called hammer head), which is integrally disposed at the end portion of each interdigital electrode; and each protruding structure is aligned with the body structure of the corresponding interdigital electrode in a third direction (or referred to as a vertical direction) D3 perpendicular to the main surface of the piezoelectric substrate.

Figure 9:
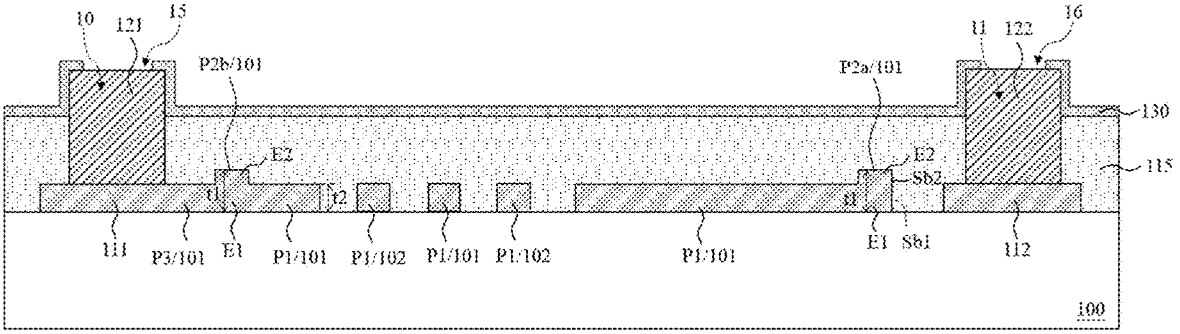
FIG. 9 is a schematic cross-sectional view of a surface acoustic wave resonator device according to some embodiments of the present disclosure, taken along line I-I' of FIG. 8.
Figure 10:
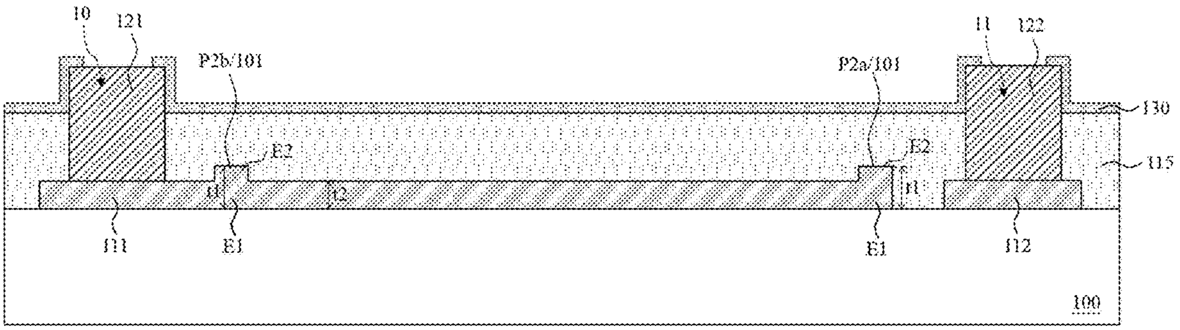
FIG. 10 is a schematic cross-sectional view of a surface acoustic wave resonator device according to some embodiments of the present disclosure, taken along line II-II' of FIG. 8.

For example, referring to FIG. 8 to FIG. 10, in each interdigital electrode, each end part (i.e., the first end part P2*a* or the second end part P2*b*) includes an end body E1 and an end protrusion E2; the end body E1 is located at a side of the central part P1 in the first direction D1 and is directly connected with the central part P1; and the end protrusion E2 is located on a side of the end body E1 away from the piezoelectric substrate 100, and is protruded, in the third direction D3 perpendicular to the main surface of the piezoelectric substrate, from a surface of other portions (e.g., the central part P1, the connecting part P3) of the interdigital electrode at a side away from the piezoelectric substrate. For example, in each interdigital electrode FE, the first end part P2*a* and the second end part P2*b* have substantially the same thickness t1; the central part P1 and the connecting part P3 have substantially the same thickness t2; the thickness t1 is greater than the thickness t2, and a difference between the thickness t1 and the thickness t2 is a thickness of the end protrusion of the corresponding end part. In some embodiments, a thickness of the first interdigital electrode lead-out part 111 and a thickness of the second interdigital electrode lead-out part 112 are also approximately equal to a thickness t2 of the central part P1 and the connecting part P3 of the interdigital electrode. It should be understood that the above thicknesses are all thicknesses in the third direction D3 perpendicular to the main surface of the piezoelectric substrate.

In other words, each interdigital electrode includes a body structure and a protruding structure; and the body structure of each interdigital electrode is constituted by the central part P1, the end bodies E1 of the end portion P2, and the connecting part P3; and the protruding structure is constituted by two end protrusions E2 of the end portion P2. In each interdigital electrode, the protruding structure is protruded from a surface of the body structure at a side away from the piezoelectric substrate in the direction perpendicular to the main surface of the piezoelectric substrate.

In some embodiments, in each interdigital electrode, the end body E1 and the end protrusion E2 of each end part are integrally formed, and there is no interface between the end body E1 and the end protrusion E2; moreover, the end part, the central part and the connecting part of each interdigital electrode are also integrally formed. In each end part, the end body E1 and the end protrusion E2 are completely aligned with each other in the third direction D3 perpendicular to the main surface of the piezoelectric substrate. Orthographic projections of the end body E1 and the end protrusion E2 on the main surface of the piezoelectric substrate may completely coincide with each other, and an area of the orthographic projection of the end body E1 is substantially equal to an area of the orthographic projection of the end protrusion E2. In each end part, widths of the end body E1 and the end protrusion E2 in the first direction D1 are equal to each other; widths of the end body E1 and the end protrusion E2 in the second direction D2 are equal to each other; a plurality of sidewalls of the end protrusion E2 and a plurality of corresponding sidewalls of the end body E1 are respectively aligned with each other in the third direction D3 perpendicular to the main surface of the piezoelectric substrate 100. That is to say, in each interdigital electrode, the protruding structure and the body structure are aligned (for example, completely aligned) with each other in the third direction, and the respective sidewalls of the protruding structure and the corresponding sidewalls of the body structure are aligned with each other in the third direction.

Referring to FIG. 8 to FIG. 10, for example, in each interdigital electrode, the body structure has two sidewalls sa1 extending in the first direction D1 and opposite to each other in the second direction D2; and each end protrusion E2 in the protruding structure has two sidewalls sa2 extending in the first direction D1 and opposite to each other in the second direction D2. The two sidewalls sa2 of each end protrusion in the protruding structure are respectively aligned with the two sidewalls sa1 of the body structure in the third direction D3 perpendicular to the main surface of the piezoelectric substrate. It should be understood that, the sidewall sa1 of the body structure extends continuously in the first direction D1, i.e., including the corresponding sidewalls of the central part P1, the end body E1 and the connecting part P3 that are aligned with each other in the first direction D1. An orthographic projection of the sidewall sa2 of the protruding structure on the piezoelectric substrate completely coincides with an orthographic projection of a portion of the sidewall sa1 of the body structure (that is, the sidewall portion of the corresponding end body) on the piezoelectric substrate. Orthographic projections of the sidewall sa1 of the body structure and the corresponding sidewall sa2 of the protruding structure on the piezoelectric substrate are presented as a straight line along the first direction D1.

Each interdigital electrode has a sidewall (or called an edge) Sb away from the interdigital electrode lead-out part connected thereto, that is, the sidewall of the first end part P2*a*. For example, the first interdigital electrode 101 has a sidewall Sb which is away from the interdigital electrode lead-out part 111 and faces the second interdigital electrode lead-out part 112; the second interdigital electrode 102 has a sidewall Sb which is away from the interdigital electrode lead-out part 112 and faces the first interdigital electrode lead-out part 111. In each interdigital electrode, the sidewall Sb is a sidewall of the first end part P2*a*, and includes a sidewall Sb1 of the end body E1 thereof and a sidewall Sb2 of the end protrusion E2 thereof. In the embodiment of the present disclosure, the sidewall Sb1 of the end body E1 and the sidewall Sb2 of the end protrusion E2 are aligned (for example, completely aligned) with each other in the third direction D3. That is, the sidewall Sb of the first end part P2*a* is a straight sidewall continuously extending along the third direction D3.

In some embodiments, the protruding structures of a plurality of interdigital electrodes together constitute a clutter suppression structure to suppress or eliminate the clutter that may exist in the resonator device.

In the surface acoustic wave resonator device provided by the embodiment of the present disclosure, the end part of the first interdigital electrode 101 and the end part of the second interdigital electrode 102 are formed with a protruding structure (i.e., the end protrusions E2), that is, the protruding structure at the end of the interdigital electrode and the body structure of the interdigital electrode are an integrated material layer without an interface therebetween; and the protruding structures are respectively aligned with the body structures of the corresponding interdigital electrodes in the vertical direction, so as to avoid the alignment deviation with respect to the interdigital electrodes during the photolithography process, thereby improving the clutter suppression capability of the resonator and the filter device, avoiding the difference in clutter suppression effects of the protruding structures, and further improving the performance and the individual consistency of the resonator and the filter.

Optionally, materials of the first interdigital electrode 101 and the second interdigital electrode 102 include a metal, for example, may include at least one of Ti, Cr, Ag, Cu, Mo, Pt, W and Al, that is, may include a single layer of the above materials or a combined stack layer of two or more of the above materials.

In some embodiments, as shown in FIG. 8 and FIG. 9, in each interdigital electrode, a thickness of the end portion P2 with the protruding structure is greater than a thickness of the central part P1 and the connecting part P3, and there is no interface between the protruding structure and the body structure.

In some embodiments, an interdigital electrode with a protruding structure is formed by using a precise etch back method, thus reducing the evaporation process and the lift-off process for forming the protruding structure in a traditional process. For example, when forming the interdigital electrodes, portions of the interdigital electrodes (e.g., the central parts and the connecting parts) are etched to thin the central parts and the connecting parts of the interdigital electrodes, so that the end portions of the interdigital electrodes are thicker than the central parts and the connecting parts, that is, a protruding structure is formed. Moreover, the protruding structure at the end and the body structure of the interdigital electrode formed by the above processes are an integrated material layer, and there is no interface between the body structure and the protruding structure; and the end protrusion and the body structure of the interdigital electrode are completely aligned with each other in the vertical direction.

In some embodiments, as shown in FIG. 8 to FIG. 10, the surface acoustic wave resonator device may be a temperature compensated surface acoustic wave resonator device, and further includes a first conductive connector 121 connected to the first interdigital electrode lead-out part 111 through a first through hole 10; a second conductive connector 122 connected to the second interdigital electrode lead-out part 112 through a second through hole 11; and a temperature compensation layer 115 covering surfaces of the first interdigital electrode 101, the second interdigital electrode 102, the first interdigital electrode lead-out part 111 and the second interdigital electrode lead-out part 112; wherein the first through hole 10 is formed by etching the temperature compensation layer 115, and a portion of the surface of the first interdigital electrode lead-out part 111 is exposed at a bottom of the first through hole 10; the second through hole 11 is formed by etching the temperature compensation layer 115, and a portion of the surface of the second interdigital electrode lead-out part 112 is exposed at a bottom of the second through hole 11.

In some embodiments, referring to FIG. 9 and FIG. 10, the surface acoustic wave resonator device further includes: a passivation layer 130 covering a surface of the temperature compensation layer 115 and portions of surfaces of the first conductive connector 121 and the second conductive connector 122; a first contact window 15 formed by etching the passivation layer 130, wherein a portion of the surface of the first conductive connector 121 is exposed at a bottom of the first contact window 15; and a second contact window 16 formed by etching the passivation layer 130, wherein a portion of the surface of the second conductive connector 122 is exposed at a bottom of the second contact window 16.

An embodiment of the present disclosure provides a filter including the surface acoustic wave resonator device described above, and the filter has the same technical effects described above with respect to the surface acoustic wave resonator device.

The embodiment of the present disclosure provides a manufacturing method for a surface acoustic wave resonator device, including: providing a base substrate; forming a plurality of interdigital electrodes on the base substrate, wherein the plurality of interdigital electrodes include first interdigital electrodes and second interdigital electrodes which extend parallel to each other in a first direction and are alternately arranged at intervals in a second direction, wherein each interdigital electrode includes a central part and end parts which are located at two opposite sides of the central part in the first direction, and the central part and the end parts have the same first thickness; and performing a thinning process to reduce a thickness of the central parts of the plurality of interdigital electrodes from the first thickness to a second thickness, so that the first thickness of the end part is greater than the second thickness of the central part, and the end part has a protruding structure protruded from the central part in a third direction perpendicular to a main surface of the base substrate.

For example, in the above-mentioned manufacturing method, each interdigital electrode further includes a connecting part, and the end parts includes a first end part and a second end part, and the connecting part is located at a side of the second end part away from the central part; and the thinning process further includes: thinning a thickness of the connecting part from the first thickness to the second thickness.

For example, the above-mentioned manufacturing method further includes: forming a first interdigital electrode lead-out part and a second interdigital electrode lead-out part on the base substrate while forming the plurality of interdigital electrodes, wherein the first interdigital electrode lead-out part is connected with the first interdigital electrodes, and the second interdigital electrode lead-out part is connected with the second interdigital electrodes; wherein the thinning process further includes: thinning a thickness of the first interdigital electrode lead-out part and a thickness of the second interdigital electrode lead-out part from the first thickness to the second thickness.

For example, in the above-mentioned manufacturing method, thinning the central parts of the plurality of interdigital electrodes to the second thickness includes: forming a mask layer on the base substrate to cover a surface of the base substrate, portions of sidewalls of the plurality of interdigital electrodes, and surfaces of the end parts of the plurality of interdigital electrodes away from the base substrate, and to expose top portions of the central parts of the plurality of interdigital electrodes away from the base substrate; and performing an etching process on the plurality of interdigital electrodes by using the mask layer as an etching mask, so as to remove the top portions of the central parts of the plurality of interdigital electrodes away from the base substrate; and removing the mask layer.

For example, in the above-mentioned manufacturing method, forming the mask layer includes: forming an initial mask layer to cover sidewalls of the plurality of interdigital electrodes, surfaces of the plurality of interdigital electrodes at a side away from the base substrate, and a surface of the base substrate; and performing a patterning process on the initial mask layer to remove a portion of the initial mask layer, and to form the mask layer including a first mask part and a second mask part, wherein the first mask part covers the surface of the base substrate and portions of sidewalls of the plurality of interdigital electrodes, and the second mask part covers surfaces of the end parts of the plurality of interdigital electrodes at a side away from the base substrate.

For example, referring to FIG. 11 to FIG. 22, an embodiment of the present disclosure provides a manufacturing method for a surface acoustic wave resonator device described above, which includes the following steps.

Figure 11:
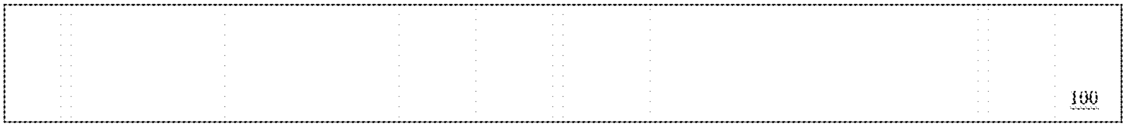
FIG. 11 to FIG. 22 are schematic cross-sectional views of structures in various steps in a manufacturing method for a surface acoustic wave resonator device provided according to some embodiments of the present disclosure.

Referring to FIG. 11, a base substrate 100 is provided. The base substrate 100 may be or include a piezoelectric substrate and may include a piezoelectric material such as lithium niobate, lithium tantalate, or the like.

Figure 12:
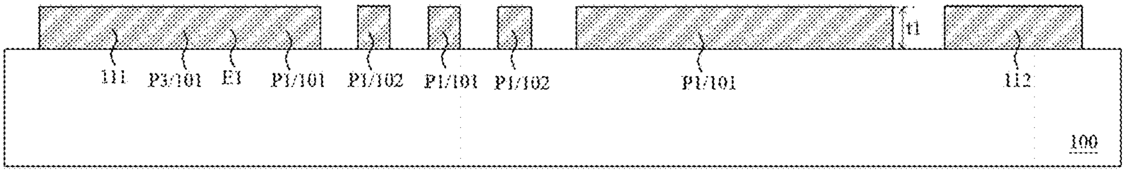

Referring to FIG. 8 and FIG. 12, first interdigital electrodes 101, second interdigital electrodes 102, a first interdigital electrode lead-out part 111 and a second interdigital electrode lead-out part 112 of an initial interdigital transducer are formed on the base substrate 100. The method for forming these components of the initial interdigital transducer may include a patterning process such as a lift-off process. Among the plurality of interdigital electrodes as formed, each interdigital electrode has a central part P1, a first end part P2*a*, a second end part P2*b* and a connecting part P3. In this step, the respective portions of the interdigital electrode and the interdigital electrode lead-out parts may have substantially the same thickness t1, and the plurality of interdigital electrodes and the interdigital electrode lead-out parts formed in this step may also be referred to as initial interdigital electrodes and initial interdigital electrode lead-out parts, respectively, and the central part and the connecting part of each initial interdigital electrode may also be referred to as initial central part and initial connecting part, respectively.

Figure 13:
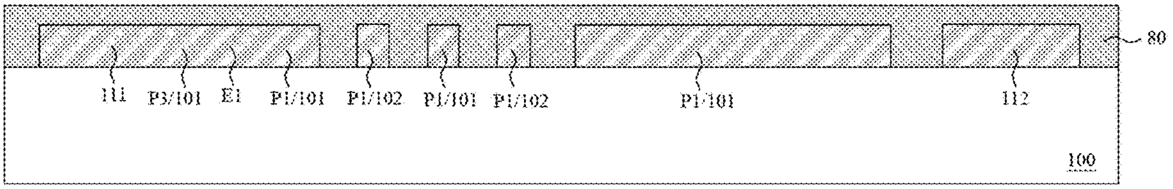

Referring to FIG. 13, a mask layer 80 is formed on the base substrate 100. The formation of the mask layer 80 may include: coating a photoresist to completely cover various portions of the initial interdigital transducer and the base substrate. The mask layer 80 in this step may also be referred to as an initial mask layer.

Figure 14:
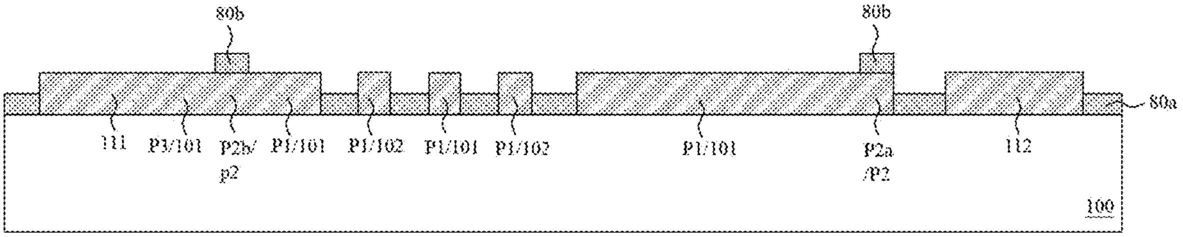

Referring to FIG. 13 and FIG. 14, a patterning process is performed on the mask layer 80 to remove portions of the mask layer 80, and to expose central parts and connecting parts of the plurality of interdigital electrodes as well as top portions of the plurality of interdigital electrode lead-out parts away from the base substrate in the third direction. For example, a photolithography process is performed on the mask layer 80, during which an exposure step is performed on the mask layer by setting a focus position and a depth of focus for exposure, so that a portion of the photoresist located at the top in the vertical direction is exposed, and the exposed part of the photoresist is removed by a development step. In the photolithography process, a portion of the mask layer 80 located on the end portions of the interdigital electrodes is covered by an additional mask such as a hard mask, so that this portion of the mask layer will not be removed. For example, after the photolithography process is performed on the mask layer 80, the remaining mask layer includes a first mask part 80*a* and a second mask part 80*b*. The first mask part 80*a* is located aside the initial interdigital transducer in a direction parallel to the main surface of the base substrate, and covers a surface of the base substrate 100 and sidewalls of bottom portions of the first interdigital electrodes 101, the second interdigital electrodes 102, the first interdigital electrode lead-out part 111 and the second interdigital electrode lead-out part 112 of the initial interdigital transducer close to the base substrate. The second mask part 80*b* is located on the end portions P2 (i.e., including the first end parts P2*a* and the second end parts P2*b*) of the plurality of interdigital electrodes to cover surfaces of the end portions P2 of the plurality of interdigital electrodes at a side away from the base substrate.

Figure 15:
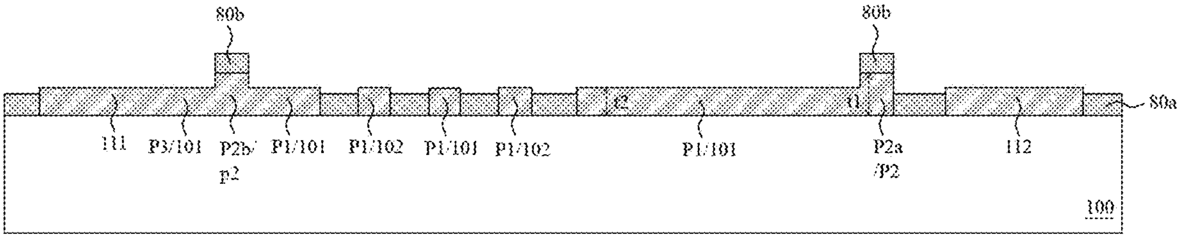

Referring to FIG. 14 and FIG. 15, an etching process such as an ion beam etching (ion beam etching; IBE) process is performed on a portion of the initial interdigital transducer not covered by the mask layer, by using the mask layer including the first mask part 80*a* and the second mask part 80*b* as an etching mask, so as to remove the central parts P1 and the connecting parts P3 of the plurality of interdigital electrodes and portions (e.g., top portions) of the plurality of interdigital electrode lead-out parts, so that the thicknesses of the central parts P1 and the connecting parts P3 of the plurality of interdigital electrodes and the thicknesses of the plurality of interdigital electrode lead-out parts are thinned from a thickness t1 to a thickness t2. In this way, first interdigital electrodes and second interdigital electrodes each having a body structure with a uniform thickness and satisfying target thickness requirements are retained. In the etching process, since the end portion P2 is covered by the second mask part 80*b*, the end portion P2 will not be removed and will not be thinned, that is, the thickness of the end portion P2 after the etching process is as same as the thickness t1 of the end portion P2 before the etching process. In this way, the thickness t1 of the end portion P2 of each interdigital electrode is greater than the thickness t2 of the central part P1, the connecting part P3 and the interdigital electrode lead-out part; that is, a protruding structure at the end portion is formed. Moreover, in the etching process, the base substrate 100 is covered and protected by the first mask part 80*a* without being damaged by etching.

Figure 16:
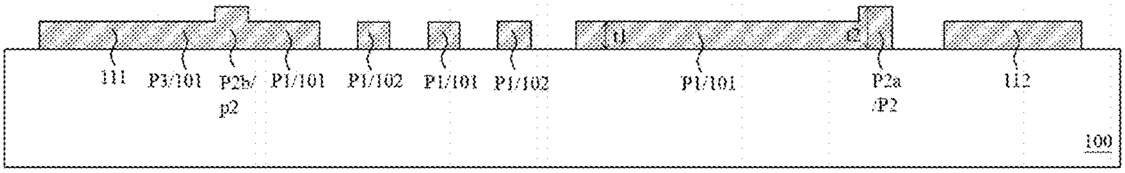

Referring to FIG. 15 and FIG. 16, the mask layer is removed, and an interdigital transducer is formed, wherein each interdigital electrode has a protruding structure located at the end portion. The protruding structure formed by the above process is self-aligned with and integrally formed with the body structure of the interdigital electrode, so there is no interface between the body structure and the protruding structure.

Figure 17:
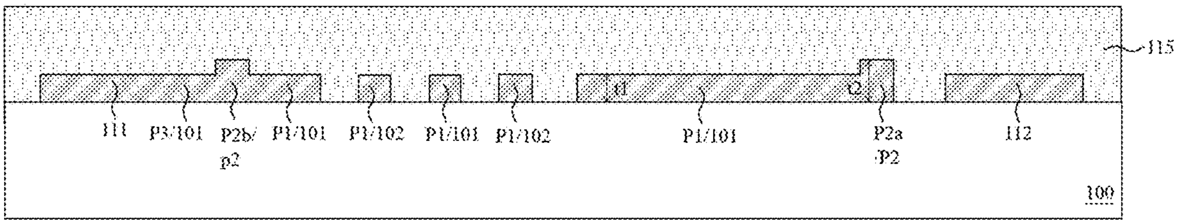

Referring to FIG. 16 and FIG. 17, a temperature compensation layer 115 is deposited, and a planarization process (for example, chemical mechanical planarization) is performed on the temperature compensation layer 115, and the temperature compensation layer 115 covers surfaces of the base substrate 100, the first interdigital electrodes 101, the second interdigital electrodes 102, the first interdigital electrode lead-out part 111 and the second interdigital electrode lead-out part 112.

Figure 18:
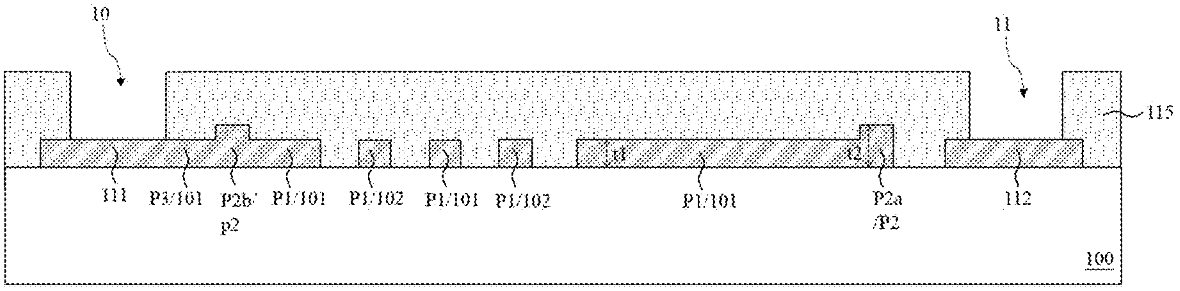

Referring to FIG. 17 and FIG. 18, the temperature compensation layer 115 is etched to form a first through hole 10 and a second through hole 11, which expose portions of surfaces of the first interdigital electrode lead-out part 111 and the second interdigital electrode lead-out part 112, respectively.

Figure 19:
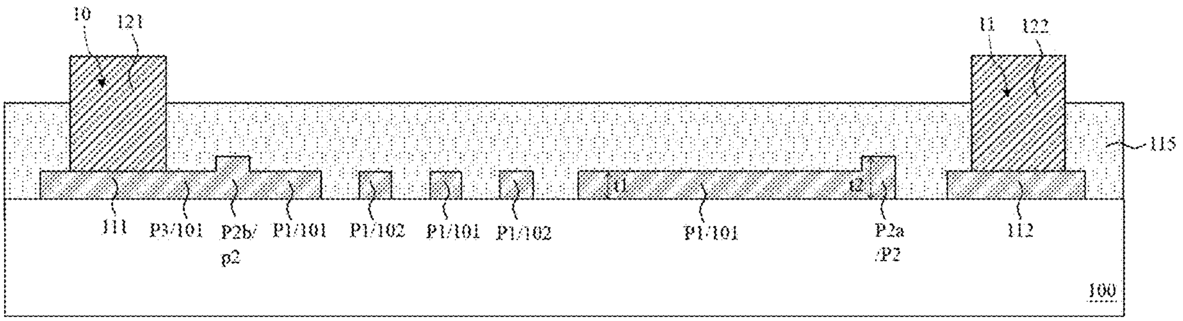

Referring to FIG. 18 and FIG. 19, a first conductive connector 121 and a second conductive connector 122 are formed. The first conductive connector 121 is connected to the first interdigital electrode lead-out part 111 through the first through hole 10, and the second conductive connector 122 is connected to the second interdigital electrode lead-out part 112 through the second through hole 11.

Figure 20:
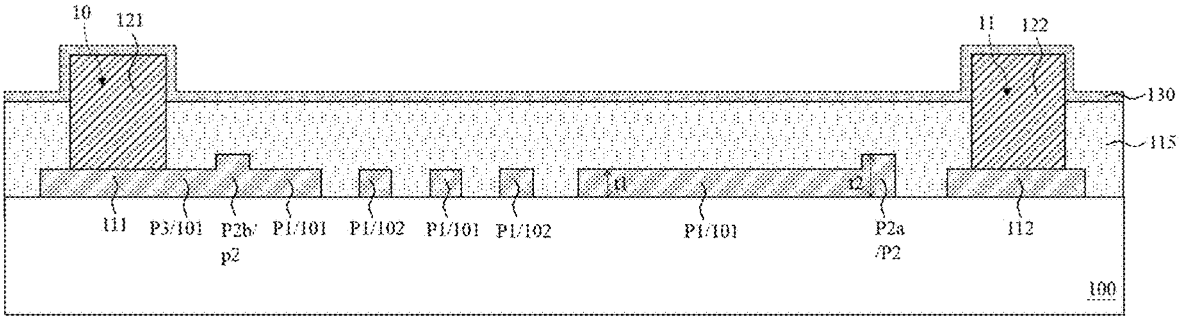

Referring to FIG. 20, a passivation layer 130 is deposited to protect the first conductive connector 121 and the second conductive connector 122, and to serve as a frequency adjustment layer for the resonator and the filter.

Figure 21:
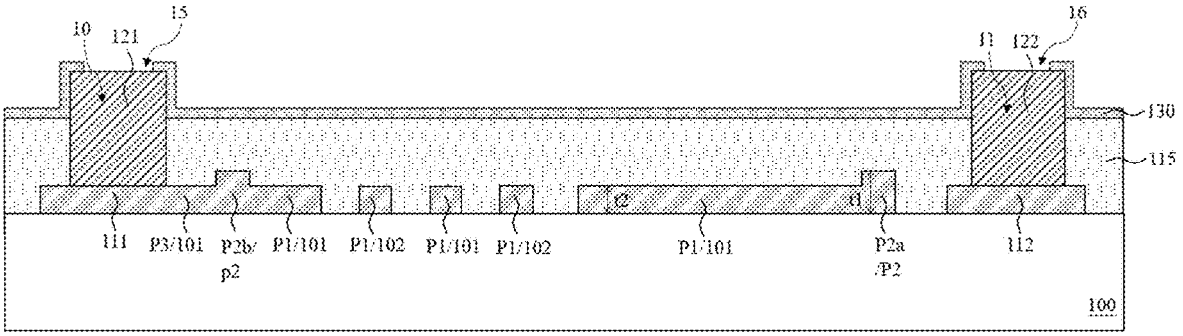
Figure 22:
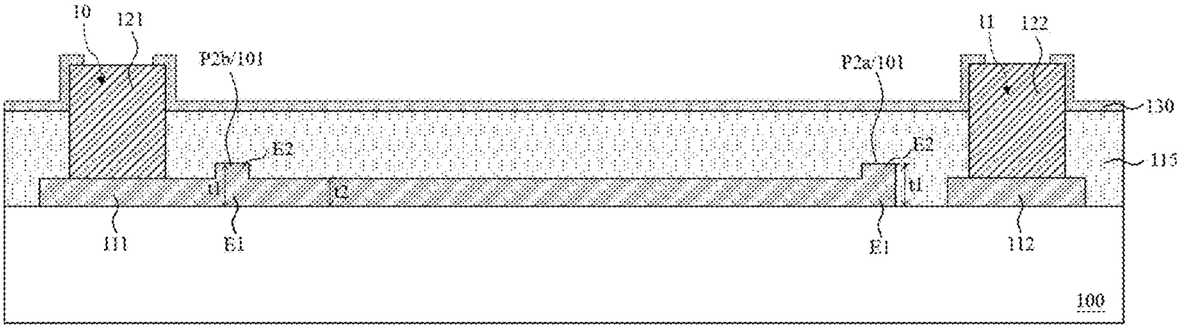

Referring to FIG. 20 and FIG. 21, the passivation layer 130 is etched to form a first contact window 15 and a second contact window 16 for external electrical connection, thereby completing the fabrication of the surface acoustic wave resonator device. FIG. 22 illustrates another cross section of the surface acoustic wave resonator device. FIG. 21 and FIG. 22 correspond to cross sections taken along line I-I' and line II-II' of FIG. 8, respectively; for specific structural features of the surface acoustic wave resonator device, reference can be made to the contents described above with respect to FIG. 8 to FIG. 10, which will not be repeated here.

During the manufacturing method for the surface acoustic wave resonator device provided by the embodiment of the present disclosure, in order to guarantee the accuracy and process efficiency in etching back (i.e., the etching as shown in FIG. 14 to FIG. 15), a semi-exposure process is used for the photolithography process performed on the mask layer, so that the remaining mask layer (e.g., the first mask part) will protect the surface of the base substrate from being etched when the metals of the central part and the connecting part of the interdigital electrode are etched. Thereafter, a method such as precise ion beam etching or the like is used to accurately etch away the redundant portions of the central part and the connecting part of the interdigital electrode, so as to retain the body structure of the interdigital electrode which has a uniform thickness and satisfies target thickness requirements, and to form the body structure of the interdigital electrode and the protruding structure used as a clutter suppression structure in a self-aligned manner. Meanwhile, the etching process will not damage the base substrate, thereby ensuring the performance of the resonator/filter.

Optionally, during the photolithography exposure process shown in FIG. 13 to FIG. 14, the focus position and the depth of focus for exposure are precisely set, so that part of the photoresist located at the top in the vertical direction is exposed, in this way, after the subsequent development process, the photoresist at the bottom still remains, and the surfaces of the central part and the connecting part of the interdigital electrode are exposed while the surface of the base substrate is still covered by the photoresist; a mask is used in the exposure process so that the photoresist on the end portions of the interdigital electrodes is not exposed, and can be remained after development.

Optionally, in the steps of FIG. 14 to FIG. 15, portions of the central part and the connecting part of the interdigital electrode are precisely etched away by using the method such as precise ion beam or the like, so as to retain the body structure of the interdigital electrode which has a uniform thickness and satisfies target thickness requirements, and to form the protruding structure at the end portion of the interdigital electrode, with the base substrate being protected by the photoresist against damage during etching. The protruding structure at the end portion and the body structure of the interdigital electrode as obtained are integrally formed, that is, they are formed from the same material layer in the same process and have no interface therebetween; and the position of the protruding structure of the interdigital electrode is self-aligned with the body structure in both horizontal and vertical directions.

Optionally, in the step shown in FIG. 17, the temperature compensation layer covers the surface of the base substrate and the surface of the interdigital electrodes; a material of the temperature compensation layer may be a single-layered structure or a multi-layered structure, for example, it may be a single layer of $SiO_2$, or a thin layer of a material such as SiN, AlN, amorphous silicon, GaN or the like stacked with a thick layer of $SiO_2$, wherein the thin layer of the material such as SiN, AlN, amorphous silicon, GaN or the like can be used as a protective layer for the interdigital electrodes and the interdigital electrode lead-out parts, so as to prevent the metal of the interdigital electrodes from being oxidized when $SiO_2$ is deposited.

Optionally, in the step shown in FIG. 19, forming the first conductive connector and the second conductive connector may include: using a patterning process such as a lift-off process. The first conductive connector and the second conductive connector include metal materials, and the metal materials may include Ti, Cr, Al, Cu, Ni, Ag, Au, etc. or a combined stack of the above materials.

Optionally, in the step shown in FIG. 20, a material of the passivation layer 130 may include an insulating material such as SiN, AlN, amorphous silicon or GaN, or a combined stack of the above materials.

The above description and the drawings fully illustrate the embodiments of the present disclosure so that those skilled in the art can practice the embodiments. Other embodiments may include structural, logical, electrical, process and other changes. The embodiments only represent possible variations. Individual components and functions are optional unless explicitly required, and the order of operations can be changed. Parts and features of some embodiments may be included in or substituted for parts and features of other embodiments. Moreover, the words used in the present disclosure are only used to describe the embodiments and are not used to limit the claims. As used in the description of the embodiments and the claims, the singular forms of "a/an" and "the" are intended to include the plural forms as well, unless the context clearly indicates. Similarly, the term "and/or" as used in the present disclosure is meant to include any and all possible combinations of one or more associated listings. In addition, when used in the present disclosure, the term "comprise" and its variants "comprises" and/or "comprising" refer to the existence of the stated feature, entirety, step, operation, element, and/or component, but do not exclude the existence or addition of one or more other features, entireties, steps, operations, elements, components and/or groups thereof. Without more restrictions, an element defined by the sentence "including one . . . " does not exclude that there are other identical elements in the process, method or equipment including this element. Herein, each embodiment can focus on the differences from other embodiments, and the same and similar parts between various embodiments can be referred to each other. For the methods and products disclosed in the embodiments, if they correspond to the method parts disclosed in the embodiments, reference can be made to the description of the method parts for the relevant portions.

What is claimed is:

1. A surface acoustic wave resonator device, comprising:

a base substrate; and an interdigital transducer, located on the base substrate and comprising:

a first interdigital electrode lead-out part;

a second interdigital electrode lead-out part;

a plurality of first interdigital electrodes, wherein each of the plurality of first interdigital electrodes has one end connected with the first interdigital electrode lead-out part, and another end facing and spaced apart from the second interdigital electrode lead-out part; and a plurality of second interdigital electrodes, wherein the plurality of second interdigital electrodes and the plurality of first interdigital electrodes extend parallel to each other in a first direction and are alternately arranged at intervals in a second direction, wherein each of the plurality of second interdigital electrodes has one end connected with the second interdigital electrode lead-out part, and another end facing and spaced apart from the first interdigital electrode lead-out part;

a temperature compensation layer, disposed on the base substrate, covering the interdigital transducer, and having a first through hole exposing a portion of a surface of the first interdigital electrode lead-out part and a second through hole exposing a portion of a surface of the second interdigital electrode lead-out part;

a first conductive connector, connected with the first interdigital electrode lead-out part through the first through hole;

a second conductive connector, connected with the second interdigital electrode lead-out part through the second through hole; and a passivation layer, covering a top surface of the temperature compensation layer at a side away from the base substrate, covering and in contact with sidewalls of upper portions of the first conductive connector and the second conductive connector, and covering and in contact with topmost surfaces of the first conductive connector and the second conductive connector at a side away from the base substrate, wherein among the plurality of first interdigital electrodes and the plurality of second interdigital electrodes, each interdigital electrode comprises a body structure and a protruding structure which are integrally formed from a same material layer, the protruding structure is disposed at an end portion of the each interdigital electrode and protruded from a surface of the body structure at a side away from the base substrate in a third direction perpendicular to a main surface of the base substrate, and wherein the protruding structure and the body structure have sidewalls aligned with each other in the third direction, wherein the each interdigital electrode comprises a central part, a first end part, a second end part and a connecting part, the first end part and the second end part are located at two opposite sides of the central part in the first direction and together constitute the end portion, and the connecting part is located at a side of the second end part away from the central part in the first direction, and is connected to a corresponding one of the first interdigital electrode lead-out part and the second interdigital electrode lead-out part;

the first end part and the second end part have a same thickness which is a first thickness, the central part, the connecting part, portions of the first interdigital electrode lead-out part and the second interdigital electrode lead-out part respectively connected to the first conductive connector and the second conductive connector have a same second thickness that is less than the first thickness, the passivation layer has a first contact window and a second contact window, and the first contact window exposes a portion of the topmost surface of the first conductive connector;

the second contact window exposes a portion of the topmost surface of the second conductive connector.

2. The surface acoustic wave resonator device according to claim 1, wherein there is free of interface between the protruding structure and the body structure.

3. The surface acoustic wave resonator device according to claim 1, wherein the first end part and the second end part each comprise an end body and an end protrusion, and the end protrusion is located on a side of the end body away from the base substrate;

in each interdigital electrode, the central part, the connecting part and the end bodies of the first end part and the second end part together constitute the body structure of the interdigital electrode; and the end protrusions of the first end part and the second end part together constitute the protruding structure.

4. The surface acoustic wave resonator device according to claim 3, wherein in each end part, widths of the end body and the end protrusion in the first direction are equal to each other, widths of the end body and the end protrusion in the second direction are equal to each other; and a plurality of sidewalls of the end body and a plurality of sidewalls of the end protrusion are respectively aligned with each other in the third direction.

5. The surface acoustic wave resonator device according to claim 1, wherein the temperature compensation layer covers surfaces of the plurality of first interdigital electrodes, the plurality of second interdigital electrodes, the first interdigital electrode lead-out part and the second interdigital electrode lead-out part.

6. A filter, comprising the surface acoustic wave resonator device according to claim 1.

7. The surface acoustic wave resonator device according to claim 1, wherein a width of the first contact window is less than a width of the topmost surface the first conductive connector; and a width of the second contact window is less than a width of the topmost surface of the second conductive connector.

8. The surface acoustic wave resonator device according to claim 7, wherein bottom portions of first conductive connector and the second conductive connector are covered by and in contact with the temperature compensation layer;

the upper portions of the first conductive connector and the second conductive connector respectively have same widths as the bottom portions of the first conductive connector and the second conductive connector;

the width of the first contact window is less than the widths of both the upper portion and the bottom portion of the first conductive connector; and the width of the second contact window is less than the widths of both the upper portion and the bottom portion of the second conductive connector.

9. A surface acoustic wave resonator device, comprising:

a base substrate; and an interdigital transducer, located on the base substrate and comprising:

a first interdigital electrode lead-out part;

a second interdigital electrode lead-out part;

a plurality of first interdigital electrodes, wherein each of the plurality of first interdigital electrodes has one end connected with the first interdigital electrode lead-out part, and another end facing and spaced apart from the second interdigital electrode lead-out part; and a plurality of second interdigital electrodes, wherein the plurality of second interdigital electrodes and the plurality of first interdigital electrodes extend parallel to each other in a first direction and are alternately arranged at intervals in a second direction, wherein each of the plurality of second interdigital electrodes has one end connected with the second interdigital electrode lead-out part, and another end facing and spaced apart from the first interdigital electrode lead-out part;

a temperature compensation layer, disposed on the base substrate, covering the interdigital transducer, and having a first through hole exposing a portion of a surface of the first interdigital electrode lead-out part and a second through hole exposing a portion of a surface of the second interdigital electrode lead-out part;

a first conductive connector, connected with the first interdigital electrode lead-out part through the first through hole;

a second conductive connector, connected with the second interdigital electrode lead-out part through the second through hole; and a passivation layer, covering a top surface of the temperature compensation layer at a side away from the base substrate, covering and in contact with sidewalls of upper portions of the first conductive connector and the second conductive connector, and covering and in contact with topmost surfaces of the first conductive connector and the second conductive connector at a side away from the base substrate, wherein among the plurality of first interdigital electrodes and the plurality of second interdigital electrodes, each interdigital electrode comprises a body structure and a protruding structure which are integrally formed from a same material layer, the protruding structure is disposed at an end portion of the each interdigital electrode and protruded from a surface of the body structure at a side away from the base substrate in a third direction perpendicular to a main surface of the base substrate, and wherein the protruding structure and the body structure have sidewalls aligned with each other in the third direction, wherein the each interdigital electrode comprises a central part, a first end part, a second end part and a connecting part, the first end part and the second end part are located at two opposite sides of the central part in the first direction and together constitute the end portion, and the connecting part is located at a side of the second end part away from the central part in the first direction, and is connected to a corresponding one of the first interdigital electrode lead-out part and the second interdigital electrode lead-out part;

the first end part and the second end part have a same thickness which is a first thickness, the central part, the connecting part, portions of the first interdigital electrode lead-out part and the second interdigital electrode lead-out part respectively connected to the first conductive connector and the second conductive connector have a same second thickness that is less than the first thickness;

wherein bottom portions of first conductive connector and the second conductive connector are covered by and in contact with the temperature compensation layer; and the upper portions of the first conductive connector and the second conductive connector respectively have same widths as the bottom portions of the first conductive connector and the second conductive connector.

* * * * *